(12) United States Patent
Milsom

(10) Patent No.: US 6,314,389 B2
(45) Date of Patent: Nov. 6, 2001

(54) TIME-DOMAIN CIRCUIT MODELLER

(75) Inventor: Robert F. Milsom, Redhill (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/156,733

(22) Filed: Sep. 17, 1998

(30) Foreign Application Priority Data

Sep. 19, 1997 (GB) .................................... 9719854

(51) Int. Cl.$^7$ ..................................................... G06F 17/50
(52) U.S. Cl. .................................. 703/14; 703/2; 703/28; 702/118
(58) Field of Search ................................. 703/20, 14, 28, 703/4, 2; 716/4; 702/118; 714/741, 742

(56) References Cited

U.S. PATENT DOCUMENTS

| | | | |
|---|---|---|---|
| 5,502,392 | * 3/1996 | Arjavalingam et al. | 324/638 |
| 5,504,423 | * 4/1996 | Fang | 324/158.1 |
| 5,566,083 | * 10/1996 | Fang | 364/489 |
| 5,625,578 | 4/1997 | Cloux et al. | 364/578 |
| 6,031,986 | * 2/2000 | Milsom | 395/500.35 |

FOREIGN PATENT DOCUMENTS

0615204A2   9/1994   (EP) .

OTHER PUBLICATIONS

"Fasterix, An Environment for PCB Simulation", by R. du Cloux et al., 10th International Zurich Symposium on Electromagnetic Compatibility, Mar. 9–11, 1993, pp. 213–218.

"EMC Simulations and Measurements", by R. du Cloux et al, 11th International Zurich Symposium on Electromagnetic Compatibility, Mar. 7–9, 1995, pp. 185–190.

"Reduced Equivalent Circuit Model for PCB", by R.F. Milsom et al, Philips Journal of Research, vol. 48, 1994 pp. 9–35.

* cited by examiner

Primary Examiner—Kevin J. Teska
Assistant Examiner—Thai Phan
(74) Attorney, Agent, or Firm—Gregory L. Thorne

(57) ABSTRACT

A method of, and apparatus for, obtaining a representation of an electrical circuit (400) suitable for time-domain simulation. The electrical circuit comprises a physical structure (102), which is modelled using electromagnetic field analysis, and also comprises a remainder circuit (104) of circuit components which are interconnected with the physical structure. The electromagnetic field analysis is capable of generating at least a high-frequency equivalent circuit which is representative of the physical structure (102) and is valid at the operating frequency of the circuit but not at DC. The method comprises including a set of DC sources ($E_1$ to $E_k$) to ensure that, in a time-domain simulation, improved DC bias conditions are provided for any non-linear components in the remainder circuit. The DC sources may be voltage sources in each interconnection, current sources between each interconnection and a zero voltage reference interconnection, or a combination of the two.

16 Claims, 5 Drawing Sheets

TIME-DOMAIN CIRCUIT MODELLER

BACKGROUND OF THE INVENTION

The present invention relates to a method of obtaining a representation of an electrical circuit suitable for time-domain simulation, and further relates to an apparatus comprising a circuit modeller for obtaining such a representation. The electrical circuit comprises a physical structure, which is modelled using electromagnetic field analysis, and also comprises a remainder circuit of circuit components which are interconnected with the physical structure.

Use of computer circuit simulation tools to predict the performance of electrical circuits, comprising a plurality of circuit components such as resistors, capacitors and transistors, is widespread in the field of electrical circuit design, resulting in savings in both time and design costs. The Philips PSTAR™ circuit simulator is one such tool, capable of various types of analysis including frequency-domain and time-domain.

Some circuit components, such as transistors and diodes, exhibit a non-linear relationship between the current passing through them and the voltage developed across their terminals. For many purposes such devices can be modelled by first establishing an operating point, from a consideration of the DC voltages applied to them, and then treating them as linear devices. This is known as small signal analysis. It is a computationally efficient model, and is the method used in frequency-domain analysis by a circuit simulator.

However, such analysis does not predict any effects caused directly by the non-linear behaviour of circuit components, such as the generation of harmonics and distortion. Such effects are not modelled in a frequency-domain analysis, but are modelled in a time-domain analysis which takes into account any non-linear relationship between current and voltage in components. Time-domain analysis requires considerably more computational resources than frequency-domain analysis, as well as more care to ensure that the results of the analysis are meaningful.

In addition to the circuit components an electrical circuit requires a physical structure to support the components and to provide electrical connections between them, for example a Printed Circuit Board (PCB) and its associated conductor pattern. It is often the case that this physical structure also affects the performance of the electrical circuit, for example through the resistance of an interconnection or mutual inductance between two interconnections. The physical structure can also be used to implement circuit components, such as inductors and capacitors, and may have additional features such as metallic enclosures for shielding purposes.

Modelling the effect of the physical structure on the performance of the electrical circuit can be done by using an electromagnetic simulator, which can determine charge and current densities, and the resulting electric and magnetic fields, throughout the structure. Preferably, the results of this analysis should be in the form of a lumped component equivalent circuit for the structure so that the electrical performance of the combination of the circuit components and the physical structure can be determined using a circuit simulator.

An example of such an electromagnetic simulator is available under the Trade Mark FASTERIX from product divisions and associated companies of Philips Electronics N. V. of Eindhoven, the Netherlands. FASTERIX™ is disclosed in the paper "FASTERIX, an environment for PCB simulation" by R du Cloux et al in the published papers of the 10th International Zurich Symposium on Electromagnetic Compatibility, Mar. 9–11, 1993, pp.213–218. Examples of its use are disclosed in this paper, as well as in the papers "Reduced Equivalent Circuit Model for PCB" by R F Milsom et al, in Philips Journal of Research, Vol 48 pp.9–35, 1994, and "EMC simulations and measurements" by R du Cloux et al in the published papers of the 11th International Zurich Symposium on Electromagnetic Compatibility, Mar. 7–9, 1995, pp. 185–190, and published European Patent Application EP-A-0 615 204 (and its equivalent granted United States patent number U.S. Pat. No. -A-5 625 578, our reference PHN 14402). The whole contents of all these three papers and EP-A-0 615 204 are hereby incorporated herein as reference material.

The electromagnetic simulator embodiment described in EP-A-0 615 204 and the said three papers is suitable for simulating a PCB layout, which has one or more conductor patterns of a uniform conductivity and thickness which may be on one or more layers on or within an insulating substrate of uniform dielectric constant, and in which electromagnetic energy loss in the conductor patterns and in the dielectric substrate is low. The standard model in the FASTERIX™ simulator is, however, very inaccurate when used directly for simulating a so-called "passive integration IC", which is an integrated circuit (IC) having thin-film passive circuit components. The predominant reasons for this inaccuracy are that energy losses are greater than in a PCB, the loss mechanisms are different, and the layer thicknesses differ much more widely.

Modifications to enable an electromagnetic simulator such as FASTERIX™ to simulate passive integration ICs are disclosed in our co-pending, unpublished PCT Application IB98/00400 (PHB 34150). The whole contents of this patent application is hereby incorporated herein as reference material.

In principle an equivalent circuit model of a physical structure can be used for time-domain simulations. Since it only includes passive, linear components a single frequency input results in a single frequency output. In practice there are considerable problems because the equivalent circuit may only be valid over a limited range of frequencies, and may contain components whose value varies with frequency. As a result it has not so far been possible to perform accurate time-domain simulations for a remainder circuit including active non-linear circuit components, where the power source introduces a DC component and the non-linearity introduces a whole spectrum of frequencies even for a single frequency AC input.

For example, two of the equivalent circuit models of a physical structure that can be generated by the FASTERIX™ simulator are known as "high-frequency" and "full-frequency". The high-frequency model is the simpler of the two and has been used successfully in time-domain simulations, but it is not correct at DC and cannot therefore be used for time-domain simulations including active non-linear components.

The full-frequency model is valid for all frequencies from DC to a specified upper limit. However, it is considerably more complex than the high-frequency model and often gives very poor results when used for time-domain simulations. One reason for this is that the additional complexity, required to obtain a valid model, gives rise to numerical instability in the circuit simulator.

SUMMARY OF THE INVENTION

An object of the present invention is to enable efficient and accurate time-domain simulation of electrical circuits comprising a physical structure, which is modelled using electromagnetic field analysis, and also comprising a remainder circuit of circuit components which are interconnected with the physical structure.

According to a first aspect of the present invention there is provided a method of obtaining a representation of an electrical circuit suitable for time-domain simulation, the electrical circuit comprising a physical structure, which is modelled using electromagnetic field analysis, and also comprising a remainder circuit of circuit components which are interconnected with the physical structure, the electromagnetic field analysis being capable of generating at least a high-frequency equivalent circuit which is representative of the physical structure and is valid at the operating frequency of the circuit but not at DC, characterised by the step of including a set of DC sources to ensure that, in a time-domain simulation, improved DC bias conditions are provided for any non-linear components in the remainder circuit.

According to a second aspect of the present invention there is provided an apparatus comprising a circuit modeller for obtaining a representation of an electrical circuit suitable for time-domain simulation, wherein the circuit modeller uses electromagnetic field analysis to model a physical structure of the electrical circuit, the electrical circuit also comprising a remainder circuit of circuit components which are interconnected with the physical structure, the electromagnetic field analysis being capable of generating at least a high-frequency equivalent circuit which is representative of the physical structure and is valid at the operating frequency of the circuit but not at DC, characterised in that the circuit modeller provides for the addition of a set of DC sources to the electrical circuit between the physical structure and the remainder circuit to ensure that, in a time-domain simulation, improved DC bias conditions are provided for any non-linear components in the remainder circuit.

The present invention is based upon the recognition, not present in the prior art, that a time-domain simulation of an electrical circuit including a physical structure and a remainder circuit does not require an equivalent circuit model of the physical structure that is valid from DC to a frequency higher than that at which the circuit operates. Instead, it is possible to use one equivalent circuit model which is valid around the frequency of operation of the circuit and contains additional DC sources to ensure correct behaviour at DC.

By means of the present invention accurate and efficient time-domain simulations of electrical circuits comprising a physical structure and a remainder circuit are enabled.

BRIEF DESCRIPTION OF THE DRAWING

Embodiments of the present invention will now be described, by way of example, with reference to the accompanying drawings, wherein.

In the drawings the same reference numerals have been used to indicate corresponding features.

DESCRIPTION OF THE PREFERRED EMBODIMENTS

Figure 1:
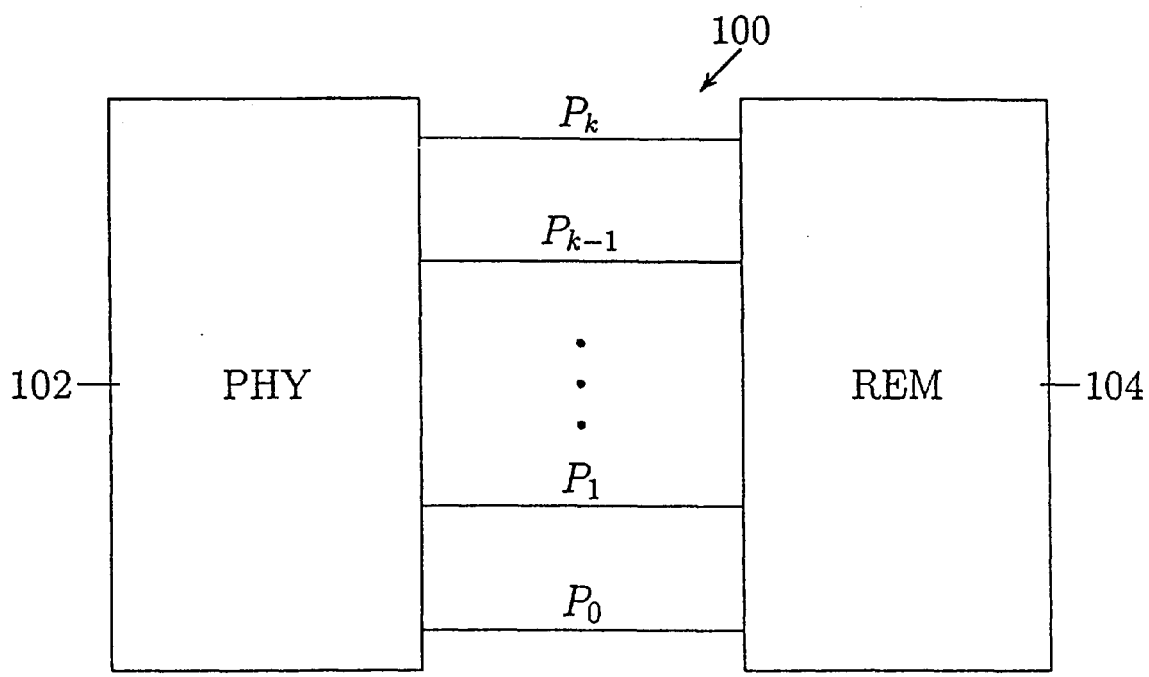
FIG. 1 is a diagram showing the partitioning of an electrical circuit into a physical structure and a remainder circuit.

FIG. 1 illustrates the concept of how an electrical circuit 100 can be partitioned into two networks, a physical structure 102 (PHY) and a remainder circuit 104 (REM), which have k+1 interconnections, labelled $P_0$ to $P_k$. Interconnection $P_0$, which could for example be a connection between the ground plane of the physical structure 102 and the remainder circuit 104, is taken as a zero voltage reference.

Figure 2:
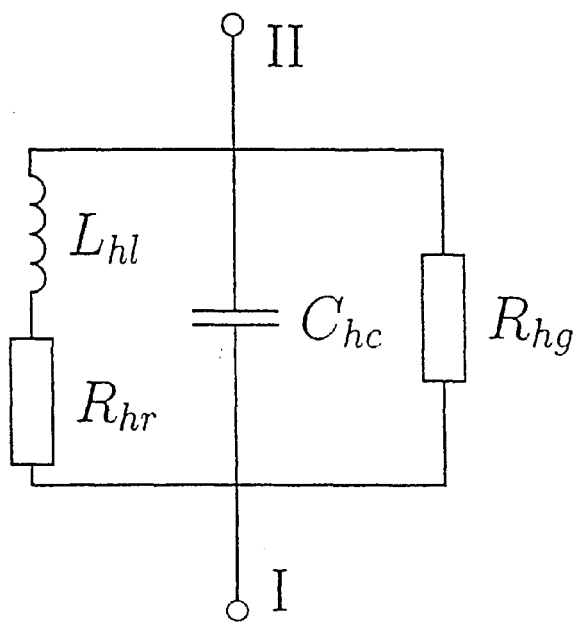
FIG. 2 is a circuit diagram of a first equivalent circuit branch model.

In order to simulate the performance of the electrical circuit 100 an equivalent circuit model for the physical structure 102 needs to be derived. Taking as an example the equivalent circuit model generated by FASTERIX™, this comprises a number of nodes with parallel branch circuits between pairs of nodes as disclosed in EP-A-0 615 204. FIG. 2 shows one example of a parallel branch circuit, used in the FASTERIX™ high-frequency model between nodes I and II. The capacitor $C_{hc}$ and inductor $L_{hl}$, respectively model the electric and magnetic fields, while resistors $R_{hr}$ and $R_{hg}$ respectively model conductor loss and dielectric loss. Strictly, the model applies only to loss free structures, in which case resistors $R_{hr}$ and $R_{hg}$ do not appear. However, loss mechanisms are modelled to a good approximation, using the circuit shown, when energy loss is small compared to the stored energy, and both dielectric loss and conductor loss are broadly homogeneous.

Figure 3:
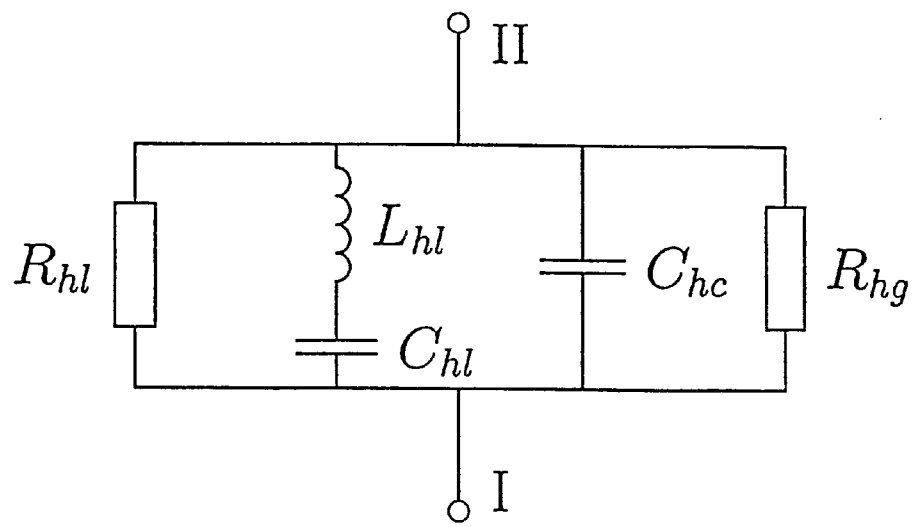
FIG. 3 is a circuit diagram of a second equivalent circuit branch model.

FIG. 3 shows another example of a parallel branch circuit, being a modification to the high-frequency branch model of FIG. 2 for application in the simulation of passive integration ICs, as disclosed in our co-pending, unpublished PCT Application IB98/00400 (PHB 34150). The modifications improve the accuracy of the model when energy loss cannot be assumed to be small compared to stored energy.

A problem with both of these parallel branch circuits is that the resistance of the branch at an operating frequency of the circuit is not, in general, equal to the DC resistance of the branch. In a frequency-domain simulation this problem can be avoided by making the resistors frequency-dependent, but a time-domain simulation requires a single circuit model that is valid for all time and therefore cannot contain frequency-dependent components. If there are no non-linear components present in the remainder circuit 104 an accurate time-domain simulation is obtained by setting the values of all the components in the parallel branch circuits to their value at a frequency $f_0$, the typical operating frequency of the circuit. For example, a circuit operating over the range 870 MHz to 930 MHz might set $f_0$ to 900 MHz.

Figure 4:
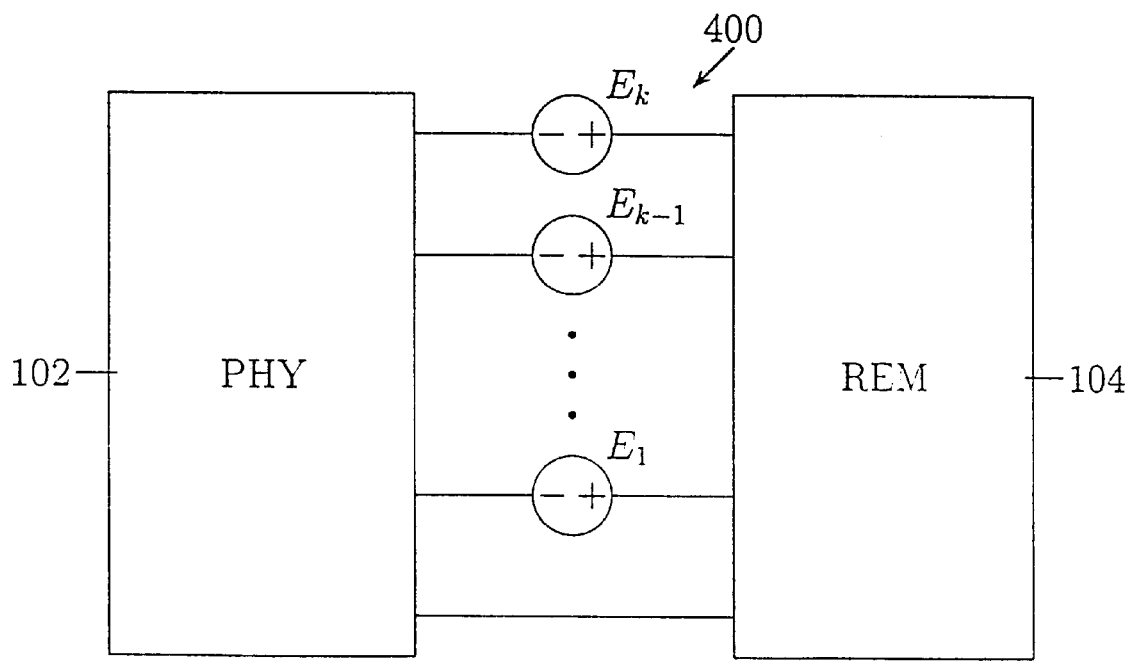
FIG. 4 is a diagram showing the addition of DC voltage sources between a physical structure and a remainder circuit, in accordance with the present invention.

If the remainder circuit 104 contains non-linear components, this approach will not give correct results since the DC bias conditions of the non-linear components will not be correctly determined by a DC simulation of an equivalent circuit valid only at a higher frequency $f_0$. A first embodiment of the present invention avoids this problem, as illustrated in FIG. 4, by the addition of k ideal DC voltage sources, $E_1$ to $E_k$, in the interconnections $P_1$ to $P_k$ between the physical structure 102 and the remainder circuit 104 to form a corrected electrical circuit 400. The values of the DC voltage sources are chosen so that, when a DC simulation is performed, the correct currents and voltages are found throughout the remainder circuit 104. The DC currents and voltages on the physical structure 102 are not necessarily correct, but this is not important since, apart from ensuring correct biasing of non-linear components, only its behaviour around $f_0$ is important.

Figure 5:
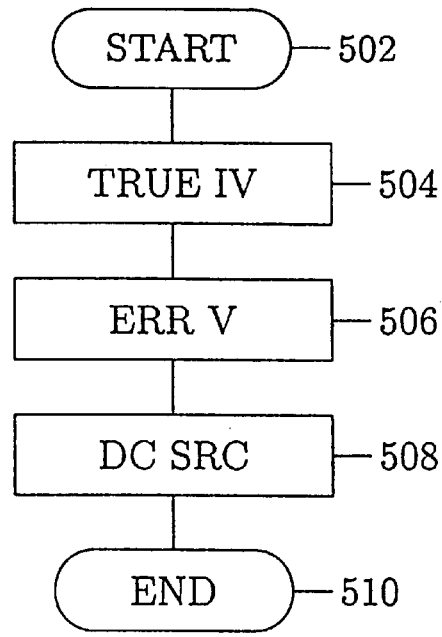
FIG. 5 is a flow chart illustrating the processing steps involved in obtaining the values of the DC voltage sources.

A procedure for determining the values for the ideal DC voltage sources is summarised in FIG. 5. After the start 502 of the procedure the first task 504 is to compute true values of the DC voltages and currents on each of the interconnections $P_1$ to $P_k$. This could be achieved by obtaining a DC equivalent circuit model of the physical structure 102 using FASTERIX™, then using PSTAR™ to perform a DC simulation on the combination of the equivalent circuit of the physical structure 102 and the remainder circuit 104 to determine the required currents and voltages.

The second task 506 is to determine the erroneous DC voltages when the true DC currents are applied to an equivalent circuit model for the physical structure 102 which is valid at frequency $f_0$. This could be achieved by obtaining a high-frequency equivalent circuit model using FASTERIX™, with a fundamental frequency of $f_0$, then using PSTAR™ to perform a DC simulation of this equivalent circuit model with current sources connected between circuit nodes corresponding to $P_0$ and each of the interconnections $P_1$ to $P_k$. Each current source is set to supply the same current as that found for the appropriate interconnection in the first task 504, and the simulation determines the resultant set of erroneous DC voltages.

The third task 508 is to determine the required values of the k ideal DC voltage sources. For each interconnection, the value of the corresponding voltage source is given by subtracting the erroneous DC voltage, found in the second task 506, from the true DC voltage, found in the first task 504. The resulting representation 400 of the electrical circuit comprises a high-frequency equivalent circuit model of the physical structure 102, valid around the frequency $f_0$, the remainder circuit 104, and additional voltage sources $E_1$ to $E_k$. Once this is done the end of the procedure 510 has been reached.

A DC simulation of this representation 400 of the electrical circuit will exhibit correct DC behaviour on the interconnections and within the remainder circuit 104 (though not within the model of the physical structure 102), thereby ensuring correct bias conditions for the active non-linear components in the remainder circuit. The DC voltage sources $E_1$ to $E_k$ have no effect on the circuit behaviour around $f_0$, where they behave as short circuits.

A more formal derivation of the tasks described above can be given in terms of resistance matrices of equivalent circuit representations of the physical structure 102.

R is a true k×k DC resistance matrix between the interconnections $P_0$ to $P_k$ of the physical structure 102. Using FASTERIX™, this can be determined by selecting the DC model for electromagnetic analysis and requesting that the resistance matrix between the points on the physical structure 102 corresponding to the interconnections is generated and output. A term $R_{mn}$ in the resistance matrix (with m≠n) is the resistance of the physical structure 102 between interconnections $P_m$ and $P_n$, while a diagonal term $R_{mm}$ in the resistance matrix is the resistance of the physical structure 102 between interconnections $P_m$ and $P_0$.

R' is an erroneous k×k resistance matrix between the interconnections $P_0$ to $P_k$ of the physical structure 102. In FASTERIX™ this can be determined by selecting the high-frequency model for electromagnetic analysis with a fundamental frequency of $f_0$ and requesting that the resistance matrix between the points on the physical structure 102 corresponding to the interconnections is generated and output.

The first task 504 determines values for v and i such that $$v=iR$$

where v is a vector of k true DC voltages on the interconnections $P_1$ to $P_k$, relative to $P_0$, and i is a vector of k true DC currents. The second task 506, to determine the erroneous DC voltages, is then equivalent to solving the matrix equation $$v'=iR'$$

where v' is a vector of k erroneous voltages on the interconnections $P_1$ to $P_k$, relative to $P_0$. The required values for the k ideal DC voltage sources are provided by the matrix equation $$e=v-v'=i(R-R')$$

where e is a vector of k voltages, giving the required value of the ideal DC voltage source $E_i$ as $e_i$. Two equivalent methods for determining e shown by this equation are:

1. determining the true v and erroneous v' DC voltages, then subtracting the erroneous voltages from the true voltages; and
2. determining the true DC currents i, then multiplying a matrix which is the difference between the true and erroneous resistance matrices by the vector of true currents.

The tasks described above can be executed separately from the electromagnetic and circuit simulators, or alternatively combined with them to form an integrated time-domain electromagnetic simulator. Although the tasks have been described with reference to the Philips simulators FASTERIX™ and PSTAR™, any electromagnetic simulator capable of generating an equivalent circuit model and any circuit simulator with equivalent functionality could be used instead.

It will be apparent to those skilled in the art that there are many alternative but equivalent ways in which the values of the DC voltage sources $E_1$ to $E_k$ could be determined, all of which are in accordance with the present invention.

Figure 6:
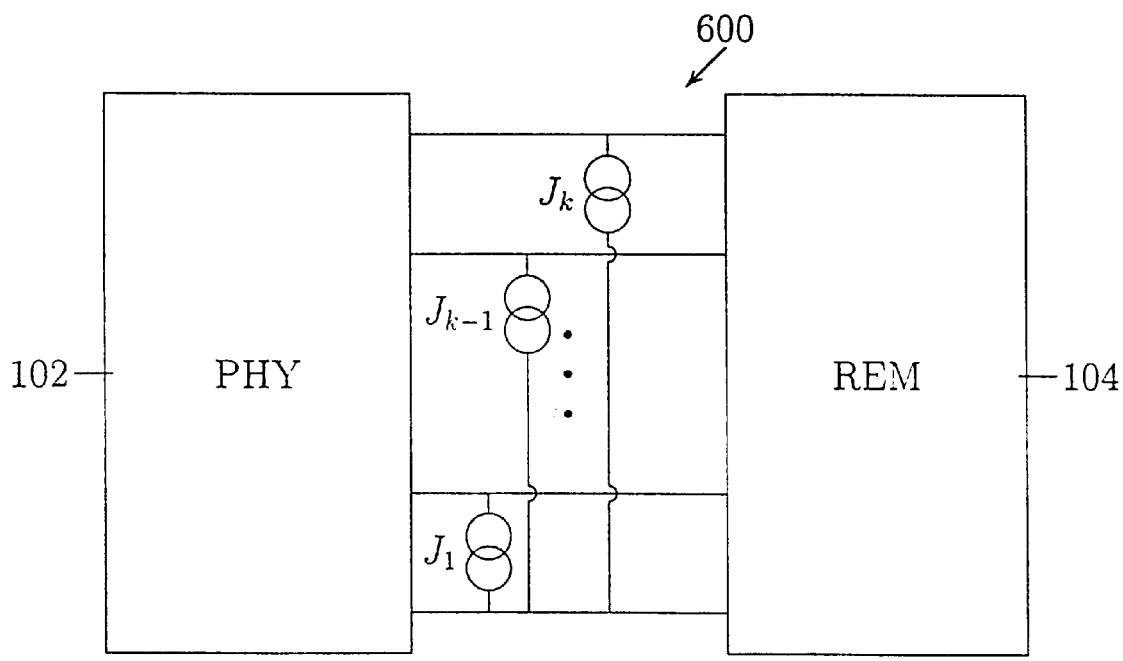
FIG. 6 is a diagram showing the addition of DC current sources to an electrical circuit.

A second embodiment of the present invention is illustrated in FIG. 6. Here k ideal DC current sources, $J_1$ to $J_k$, have been added between each of the interconnections $P_1$ to $P_k$ and the reference interconnection $P_0$ to form a corrected electrical circuit 600. As with the first embodiment using voltage sources, the values of the DC current sources are chosen so that, when a DC simulation is performed, the correct voltages and currents are found within the remainder circuit 104.

A procedure for determining the values for the ideal DC current sources is very similar to that described above for determining the values of the ideal DC voltage sources in the first embodiment of the invention. The first task, determining true values of the DC voltages and currents on each of the interconnections $P_1$ to $P_k$, is identical to the first task 504 of the first embodiment.

The second task is to determine the erroneous DC currents when the true DC voltages are applied to an equivalent circuit model for the physical structure 102 which is valid at frequency $f_0$. This could be achieved by obtaining a high-frequency equivalent circuit model using FASTERIX™, with a fundamental frequency of $f_0$, then using PSTAR™ to perform a DC simulation of this equivalent circuit model with voltage sources connected between circuit nodes corresponding to $P_0$ and each of the interconnections $P_1$ to $P_k$. Each voltage source is set to the same voltage as that found for the appropriate interconnection in the first task, and the simulation determines the resultant set of erroneous DC currents.

The third task is to determine the required values of the k ideal DC current sources. For each interconnection, the value of the corresponding current source is given by subtracting the erroneous DC current, found in the second task, from the true DC current, found in the first task. The resulting representation 600 of the electrical circuit comprises a high-frequency equivalent circuit model of the physical structure 102, valid around the frequency $f_0$, the remainder circuit 104, and additional current sources $J_1$ to $J_k$.

A DC simulation of this representation 600 of the electrical circuit will exhibit correct DC behaviour on the interconnections and within the remainder circuit 104 (though not within the model of the physical structure 102), thereby ensuring correct bias conditions for the active non-linear components in the remainder circuit. The DC current sources $J_1$ to $J_k$ have no effect on the circuit behaviour around $f_0$, where they behave as open circuits.

A more formal derivation of the tasks described above can be given in terms of the resistance matrices, R and R', defined for the first embodiment. Introducing j as a vector of k currents, giving the required value of the ideal DC current source $J_i$ as $j_i$, $$v = iR = (i-j)R'$$

This can be seen by observing that if the correct current $i_m$ flows into the remainder circuit 104 from the interconnection $P_m$, the current flowing out of the erroneous DC equivalent circuit of the physical structure 102 is $i_m - j_m$. The vector j is determined by manipulating the above equation:

$$j = i(R' - R)R'^{-1}$$
$$= i - iRR'^{-1}$$
$$= i - vR'^{-1}$$
$$= i - i'$$

where $R'^{-1}$ is the matrix inverse of the erroneous resistance matrix R' and i' is a vector of k erroneous currents on the interconnections $P_1$ to $P_k$. Two equivalent methods for determining j shown by these equations are:

1. determining the true i and erroneous i' DC currents, then subtracting the erroneous currents from the true currents; and
2. determining the true DC voltages v, then multiplying a matrix $R'^{-1}$ which is the inverse of the erroneous resistance matrix R' by the vector of true voltages.

It will be apparent to those skilled in the art that there are many alternative but equivalent ways in which the values of the DC current sources $J_1$ to $J_k$ could be determined, all of which are in accordance with the present invention.

It will also be apparent that since each of the voltage sources in the first embodiment and current sources in the second embodiment corrects the DC conditions for one of the interconnections, further embodiments are possible where voltage sources are used to correct the DC behaviour of some of the interconnections and current sources are used to correct the DC behaviour of the remainder.

Time-domain simulations can now be performed on one of the corrected electrical circuits 400,600, comprising a high-frequency equivalent circuit model of the physical structure 102 (with frequency set to $f_0$ in all frequency-dependent components), the remainder circuit 104 and the set of ideal DC voltage sources $E_1$ to $E_k$ or ideal DC current sources $J_1$ to $J_k$. This is now illustrated by one specific example of a practical application, using the first embodiment with voltage sources.

Figure 7:
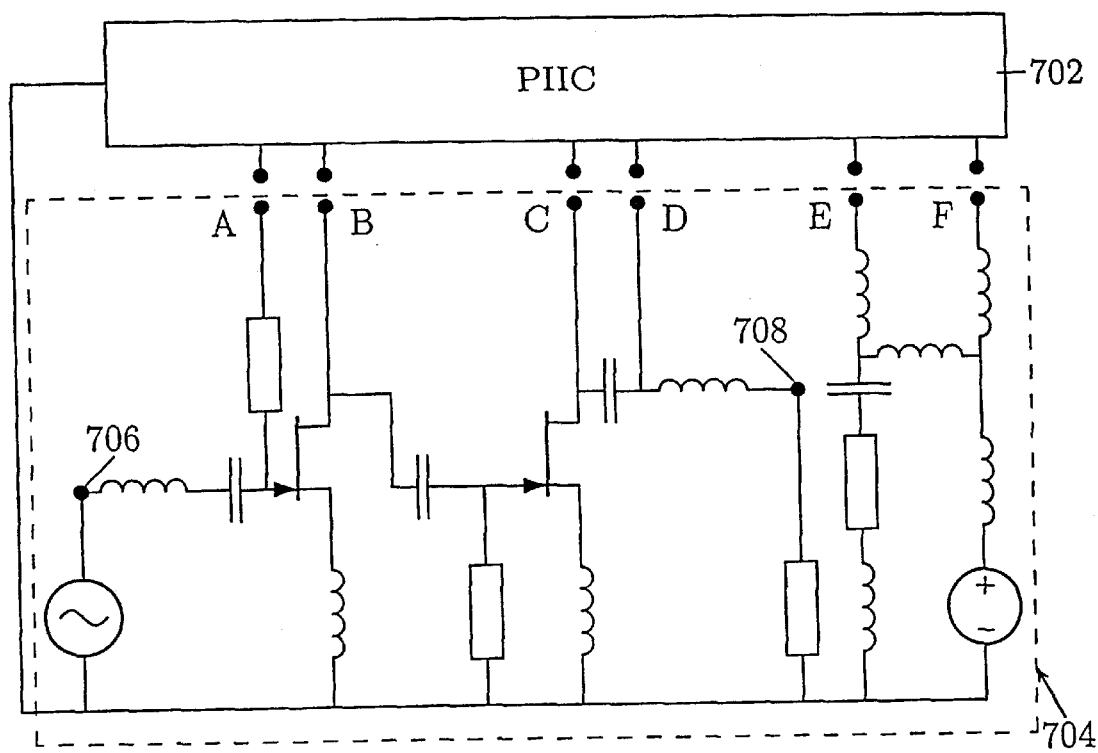
FIG. 7 is a circuit diagram of a power amplifier for a cordless telephone handset.

FIG. 7 is a schematic circuit diagram of a power amplifier for a cordless telephone handset. The circuit comprises a physical structure 702, implemented as a passive integration IC (PIIC), and a remainder circuit 704, part of which is implemented as a GaAs IC. The remainder circuit 704 includes two GETS, additional passive components, a DC power supply, and connection points for radio frequency input 706 and output 708. The points at which the physical structure 702 and remainder circuit 704 are connected are labelled with letters A to F.

Figure 8:
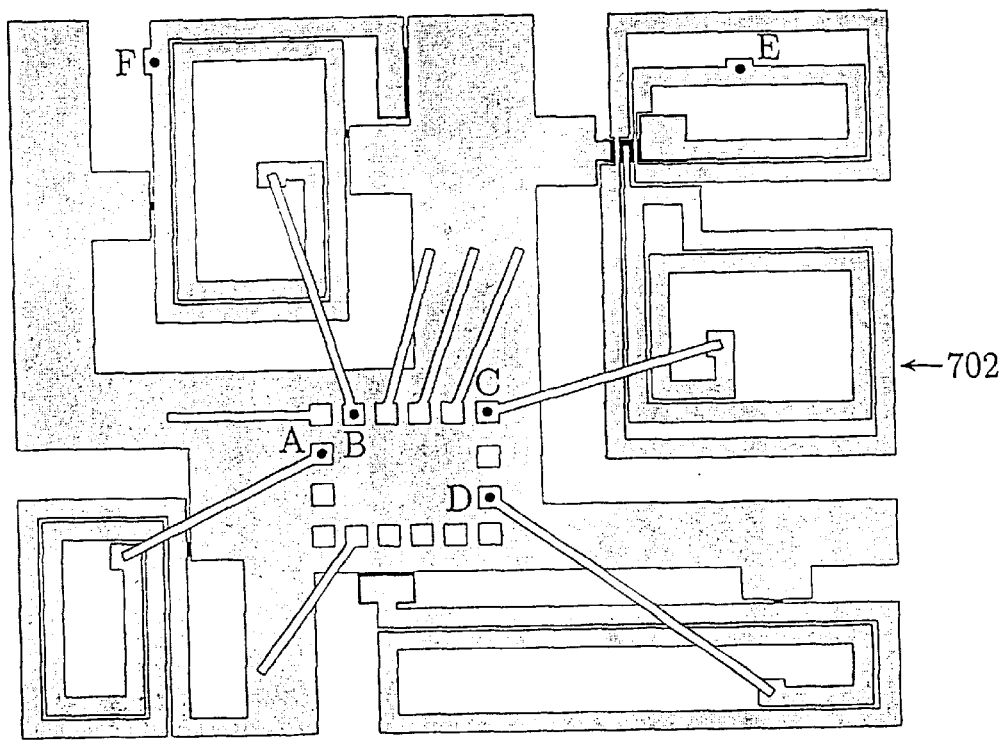
FIG. 8 is a plan view of the conductor pattern of a passive integration IC implementing part of the power amplifier circuit.

FIG. 8 is a plan view of the conductor pattern of the physical structure 702, comprising three conductor layers indicated with different shading. The GaAs IC part of the remainder circuit is mounted centrally on the physical structure on the 16 pads, including those labelled A to D. The physical structure 702 implements a network of integrated inductors and capacitors. The physical locations of the six connection points between the physical structure 702 and the remainder circuit 704 are indicated by the letters A to F, corresponding to the same letters in the circuit diagram of FIG. 7.

Figure 9:
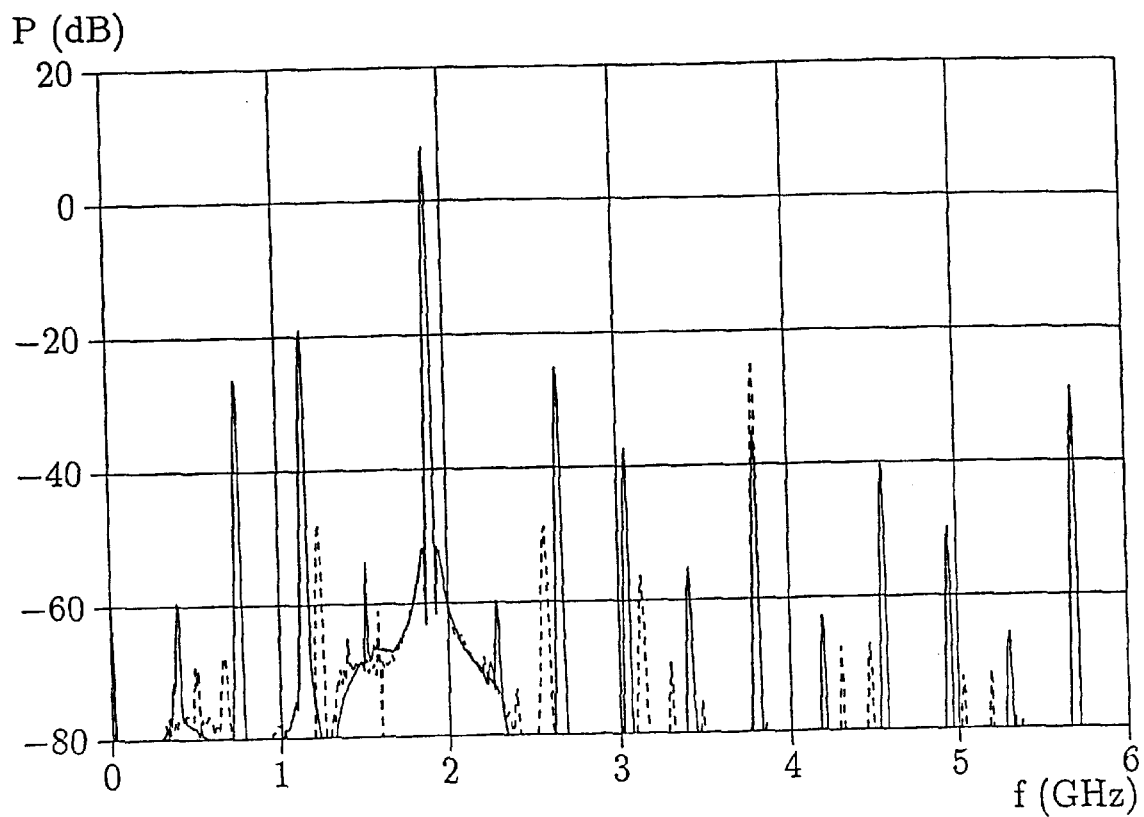
FIG. 9 is a graph of the simulated output spectrum of the power amplifier with the physical structure of the passive integration IC modelled as ideal components (broken curve) compared with the simulation using the invention (continuous curve)

FIG. 9 is a graph of the simulated output spectrum of the amplifier, obtained by Fourier transformation of the time-domain response with a sinusoidal input of 6 dBm at 1.9 GHz. The graph shows output power P in dB against frequency f in GHz. The broken curve is the spectrum obtained when the model used for the physical structure 702 is simply the set of ideal inductors and capacitors that the structure is designed to implement. The continuous curve is the spectrum obtained when an electromagnetic simulation is performed to obtain an equivalent circuit of the physical structure 702 (in the form of parallel branches as shown in FIG. 3) and six additional DC sources are inserted at the nodes labelled A to F in FIGS. 7 and 8. The values for the DC sources were calculated according to the present invention.

Both output spectra show several spurious responses, due to the non-linearity of the FETs, as well as the required output at 1.9 GHz. Both simulations predict similar outputs for the fundamental at 1.9 GHz, as well as the second and third harmonics at 3.8 GHz and 5.7 GHz respectively. The spectrum from the electromagnetic simulation with correcting DC sources indicates a strong, unexpected resonance a 0.75 GHz, as well as intermodulation products between this and the input signal at 1.15 GHz, 2.65 GHz and 3.05 GHz. These unwanted outputs are caused by interaction between the electromagnetic structure and the other devices. Use of the present invention to predict this problem enabled corrective action to be taken before the expensive and time-consuming steps of mask-making and fabrication of the passive IC had been undertaken.

A process for designing electrical circuits which includes the steps of obtaining a representation of the circuit in accordance with the present invention and performing time-domain circuit simulations on it to determine how it will behave in practice has the potential for considerable time and costs savings by the avoidance of additional design iterations normally required to obtain a correctly functioning circuit.

Figure 10:
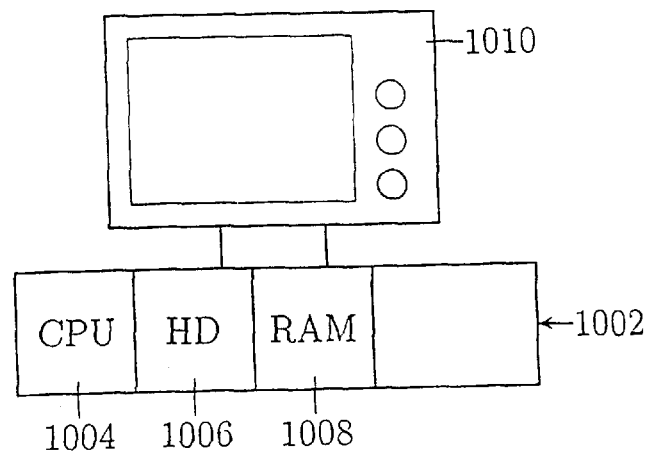
FIG. 10 illustrates typical computer hardware for implementing the invention.

FIG. 10 shows diagrammatically typical computer hardware for implementing the invention. The hardware consists of a workstation comprising a computer console 1002 having a central processing unit (CPU) 1004, a storage device such as a hard disk (HD) 1006, random access memory (RAM) 1008 and a monitor 1010. In use the circuit modelling and simulation programs, such as FASTERIX™ and PSTAR™, are stored on the hard disk 1006, together with data defining the physical structure 102, remainder circuit 104 and required analyses. Alternatively, the programs and data may be provided by any other known means, for example being stored remotely and loaded across a network. The CPU 1004 reads the programs and data into RAM 1008, performs the required calculations and ultimately provides an output which may be displayed on a monitor 1010 and/or printed out on a plotter (not shown).

From reading the present disclosure, other modifications will be apparent to persons skilled in the art. Such modifications may involve other features which are already known in methods of obtaining representations of electrical circuits and in the computer-aided design and manufacture of electrical circuits, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of features during the prosecution of the present application or of any further application derived therefrom.

What is claimed is:

1. A method of obtaining a representation of an electrical circuit suitable for time-domain simulation, the electrical circuit comprising a physical structure, which is modelled using electromagnetic field analysis, and also comprising a remainder circuit of circuit components which are interconnected with the physical structure, the electromagnetic field analysis being capable of generating at least a high-frequency equivalent circuit which is representative of the physical structure and is valid at the operating frequency of the circuit but not at DC, characterised by the step of determining a set of constant DC sources to ensure that, in a time-domain simulation, improved DC bias conditions are provided for any non-linear components in the remainder circuit.

2. A method as claimed in claim 1, characterised in that one of the interconnections between the physical structure and the remainder circuit is identified as a zero voltage reference and in that the constant DC sources are constant voltage sources, which are placed in all the interconnections except the zero voltage reference.

3. A method as claimed in claim 2, characterised in that the values of the constant DC voltage sources are determined by a method including the steps of:

performing a first DC simulation of the DC equivalent circuit and the remainder circuit to determine DC currents through and DC voltages on each of the interconnections;

performing a second DC simulation of the high-frequency equivalent circuit with DC current sources each having the value determined in the first simulation connected between each interconnection and the zero voltage reference to determine erroneous DC voltages on each of the interconnections; and for each interconnection except the zero voltage reference subtracting the erroneous voltage on it determined by the second simulation from the voltage determined by the first simulation to provide the required value for the constant voltage source included in it.

4. A method as claimed in claim 1, characterised in that one of the interconnections between the physical structure and the remainder circuit is identified as a zero voltage reference and in that the constant DC sources are constant current sources, which are placed between each of the interconnections and the zero voltage reference.

5. A method as claimed in claim 4, characterised in that the values of the constant DC current sources are determined by a method including the steps of:

performing a first DC simulation of the DC equivalent circuit and the remainder circuit to determine DC currents through and DC voltages on each of the interconnections;

performing a second DC simulation of the high-frequency equivalent circuit with DC voltage sources each having the value determined in the first simulation connected between each interconnection and the zero voltage reference to determine erroneous DC currents through each of the interconnections; and for each interconnection except the zero voltage reference subtracting the erroneous current through it determined by the second simulation from the current determined by the first simulation to provide the required value for the constant current source between it and the zero voltage reference.

6. A method as claimed in claim 1, characterised in that one of the interconnections between the physical structure and the remainder circuit is identified as a zero voltage reference and in that one or more of the interconnections have a constant DC voltage source added to them and the remainder of the interconnections have a constant DC current source placed between them and the zero voltage reference.

7. A method of obtaining the time-domain behaviour of an electrical circuit comprising the steps of obtaining a representation of the electrical circuit as claimed in claim 1, and of performing a time-domain simulation of the representation of the electrical circuit with any suitable circuit simulator.

8. A method of designing an electrical circuit comprising a design loop of determining the performance of a prototype as claimed in claim 7 and modifying the design to correct any defects identified, the design loop terminating when the performance of the electrical circuit meets its target specification.

9. The apparatus of claim 1, wherein one of the interconnections between the physical structure and the remainder circuit is a zero voltage reference and the constant DC sources are constant voltage sources that are placed in all the interconnections except the zero voltage reference.

10. The apparatus of claim 9, comprising:

a means for performing a first DC simulation of the DC equivalent circuit and the remainder circuit to determine DC currents through and DC voltages on each of the interconnections;

a means for performing a second DC simulation of the high-frequency equivalent circuit with DC current sources each having the value determined in the first simulation connected between each interconnection and the zero voltage reference to determine erroneous DC voltages on each of the interconnections; and a means for subtracting the erroneous voltage determined by the second simulation from the voltage determined by the first simulation to provide the required value for the constant voltage source for each interconnection except the zero voltage reference.

11. An apparatus comprising a circuit modeller for obtaining a representation of an electrical circuit suitable for time-domain simulation, wherein the circuit modeller uses electromagnetic field analysis to model a physical structure of the electrical circuit, the electrical circuit also comprising a remainder circuit of circuit components which are interconnected with the physical structure, the electromagnetic field analysis being capable of generating at least a high-frequency equivalent circuit which is representative of the physical structure and is valid at the operating frequency of the circuit but not at DC, characterised in that the circuit modeller provides for the addition of a set of constant DC sources to the electrical circuit between the physical structure and the remainder circuit to ensure that, in a time-domain simulation, improved DC bias conditions are provided for any non-linear components in the remainder circuit.

12. The apparatus of claim 11, wherein one of the interconnections between the physical structure and the remainder circuit is identified as a zero voltage reference and the constant DC sources are constant current sources that are placed between each of the interconnections and the zero voltage reference.

13. The apparatus of claim 12, comprising:

a means for performing a first DC simulation of the DC equivalent circuit and the remainder circuit to determine DC currents through and DC voltages on each of the interconnections;

a means for performing a second DC simulation of the high-frequency equivalent circuit with DC voltage sources each having the value determined in the first simulation connected between each interconnection and the zero voltage reference to determine erroneous DC currents through each of the interconnections; and a means for subtracting the erroneous current determined by the second simulation from the current determined by the first simulation to provide the required value for the constant current source between each interconnection and the zero voltage reference for each interconnection except the zero voltage reference.

14. The apparatus of claim 11, wherein one of the interconnections between the physical structure and the remainder circuit is identified as a zero voltage reference and one or more of the interconnections have a constant DC voltage source added to them and the remainder of the interconnections have a constant DC current source placed between them and the zero voltage reference.

15. The apparatus of claim 11, comprising a means for performing a time-domain simulation of the representation of the electrical circuit.

16. The apparatus of claim 15, comprising a means for performing a design loop for determining the performance of a prototype and modifying the design to correct any defects identified, the design loop terminating when the performance of the electrical circuit meets its target specification.

* * * * *